(12) United States Patent
Liu et al.

(10) Patent No.: US 7,166,483 B2
(45) Date of Patent: Jan. 23, 2007

(54) HIGH BRIGHTNESS LIGHT-EMITTING DEVICE AND MANUFACTURING PROCESS OF THE LIGHT-EMITTING DEVICE

(75) Inventors: Yu-Chuan Liu, Ping-zhen (TW);
Chia-Ming Lee, Yilan County (TW);
I-Ling Chen, Yilan County (TW);
Jen-Inn Chyi, Pingzhen (TW)

(73) Assignee: Tekcore Co., Ltd. (TW)

( * ) Notice: Subject to any disclaimer, the term of this patent is extended or adjusted under 35 U.S.C. 154(b) by 23 days.

(21) Appl. No.: 10/870,347

(22) Filed: Jun. 17, 2004

(65) Prior Publication Data
US 2005/0279990 A1 Dec. 22, 2005

(51) Int. Cl.
*H01L 21/00* (2006.01)
(52) U.S. Cl. .............................. 438/29; 438/39; 438/46
(58) Field of Classification Search ................ 438/29, 438/31, 32, 38, 39, 42, 46, 47
See application file for complete search history.

(56) References Cited

U.S. PATENT DOCUMENTS 6,194,743 B1 * 2/2001 Kondoh et al. ............... 257/94
6,936,859 B1 * 8/2005 Uemura et al. ............... 257/99

FOREIGN PATENT DOCUMENTS

TW 554549 9/2003
WO WO 01/47038 A1 12/2000

* cited by examiner

*Primary Examiner*—Kevin M. Picardat
(74) *Attorney, Agent, or Firm*—Baker & McKenzie LLP

(57) ABSTRACT

A light-emitting device comprises a multi-layer structure including one or more active layer configured to irradiate light in response to the application of an electric signal, a transparent passivation layer laid over an outmost surface of the multi-layer stack, a reflector layer laid over the passivation layer, and a plurality of electrode pads coupled with the multi-layer structure. In a manufacture process of the light-emitting device, the reflector layer and the passivation layer are patterned to form at least one opening exposing an area of the multi-layer structure. One electrode pad is formed through the opening of the reflector layer and the passivation layer to connect with the multi-layer structure.

6 Claims, 4 Drawing Sheets

HIGH BRIGHTNESS LIGHT-EMITTING DEVICE AND MANUFACTURING PROCESS OF THE LIGHT-EMITTING DEVICE

BACKGROUND OF THE INVENTION

1. Field of the Invention

The present invention generally relates to light-emitting devices, and particularly to the structure and manufacture of a light-emitting device having high-brightness characteristic.

2. Description of the Related Art

A light-emitting diode is conventionally composed of a multi-layer structure including active layers sandwiched between n-type and p-type semiconductor layers. The active layers are configured to irradiate light in response to an electric signal applied between electrodes of the light-emitting diode. The electric stimulation creates an injection of electrons and holes from the n-type and p-type semiconductor layers into the active layers where they recombine to produce light.

Conventionally, the efficiency of the light-emitting diode can be characterized through a number of indicative factors. One factor is the light extraction efficiency, which is the ratio of the amount of light leaving the light-emitting diode relative to the amount of light produced in the light-emitting diode. Practically, the amount of light leaving the light-emitting diode is less than the amount of light produced in the light-emitting diode due to diverse inner absorption paths. To increase the light extraction efficiency, reflectors are conventionally placed inside the multi-layer structure of the light-emitting diode to redirect light into useful directions.

To address the foregoing issue, one approach known in the art consists of forming a p-type electrode made of silver (Ag) on the p-type layer of the light-emitting diode. This technique is described in, for example, U.S. Pat. No. 6,194,743, the disclosure of which is incorporated herein by reference. The high reflectance of Ag contributes to form a reflective p-type electrode capable of redirecting light towards the substrate, and absorption through the p-type electrode can be thereby prevented.

Another approach known in the art is described in PCT application number PCT/US00/35184, the disclosure of which is incorporated herein by reference. This other approach proposes a multi-layer reflective contact structure that includes specific reflective metal layers selected to optimize the reflectance and electric characteristic of the contact.

Though the foregoing techniques contribute to enhance the light extraction of the light-emitting device, but experiment tests show that the reflective metallic contact may be the cause of an unstable thermal behavior of the light-emitting diode. For example, if the operating voltage of the light-emitting diode is initially set at 3.3V, assembling the light-emitting diode on a substrate via a reflow process at a temperature of 250° C. will bias the operating voltage to 4.2V. Such a voltage deviation is undesirable. The device stability may be slightly improved with the association of indium tin oxide (ITO) with silver, but ITO has a poor adhesion in respect of metal.

Therefore, there is presently a need for a light-emitting device that can overcome the prior disadvantages and provide high-brightness characteristic.

SUMMARY OF THE INVENTION

The application describes a high-brightness light-emitting device and a manufacturing process of the light-emitting device which effectively separate the reflector layer from the ohmic contact layer of the light-emitting device to prevent unstable thermal behavior.

In one embodiment, the light-emitting device comprises a multi-layer structure including one or more active layer configured to irradiate light in response to the application of an electric signal, a passivation layer laid over an outmost surface of the multi-layer stack, a reflector layer laid over a surface of the passivation layer, and a plurality of electrode pads coupled with the multi-layer structure.

In one embodiment, a process of forming the light-emitting device includes patterning the reflector layer and the passivation layer to form at least one opening exposing an area of the multi-layer structure, and forming one electrode pad connecting with the multi-layer structure through the opening patterned through the reflector layer and the passivation layer.

In an embodiment, the light-emitting device is mounted on a substrate provided with a plurality of contact pads. In a variant embodiment, the electrode pads of the light-emitting device are connected to the contact pads of the substrate via conductive bumps.

The foregoing is a summary and shall not be construed to limit the scope of the claims. The operations and structures disclosed herein may be implemented in a number of ways, and such changes and modifications may be made without departing from this invention and its broader aspects. Other aspects, inventive features, and advantages of the invention, as defined solely by the claims, are described in the non-limiting detailed description set forth below.

DETAILED DESCRIPTION OF THE EMBODIMENT(S)

The application describes a high-brightness light-emitting device and a manufacturing process of the light-emitting device which improve the thermal property of the light-emitting device by effectively separating the reflector layer from the ohmic contact of the light-emitting device.

Figure 1A:
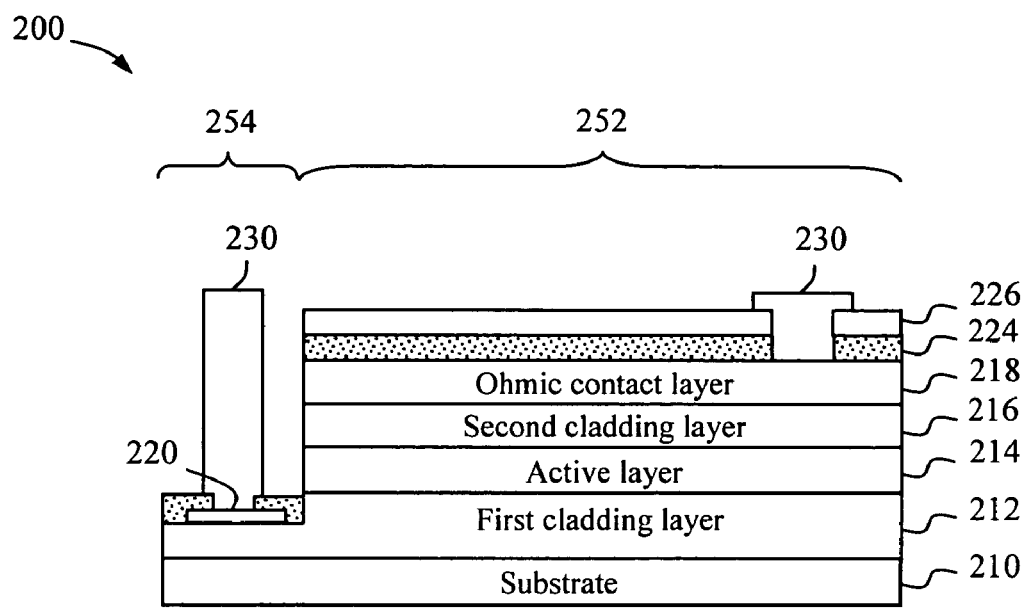
FIG. 1A is a schematic view of a light-emitting device according to an embodiment of the invention.

FIG. 1A is a schematic view of a light-emitting device constructed according to an embodiment of the invention. In a light-emitting area 252, the light-emitting device 200 is composed of a multi-layer structure including a substrate 210, a first cladding layer 212, an active layer 214, a second cladding layer 216, and a first ohmic contact layer 218 stacked up, respectively. In an area 254 adjacent to the light-emitting area 252, the multi-layer structure is reduced to the stack of the substrate 210 and the first cladding layer 212, on which is formed a second ohmic contact layer 220. It is understood that the multi-layer structure as described above is only provided for purposes of illustration, and other layer structures of electroluminescent materials can be implemented in the invention.

A passivation layer 224 is formed to cover the areas 252, 254 of the light-emitting device 200. The passivation layer 224 can be made of any adequate transparent dielectric material. A reflector layer 226 is formed on the surface of the passivation layer 224 in the light-emitting area 252. The reflector layer 226 is made of a material having high reflectance characteristic, the composition of which can include Pd, Rh, Ag, Al, Ni, Pt, Ti, Cu, Au, Cr, In, Sn, Ir, or the like. For the purpose of illustration, a good reflector can be characterized by a light absorption of less than about 35%. Electrode pads 230 connect to the first, second ohmic contact layer 218, 220 through the passivation layer 224 and reflector layer 226. The isolation of the reflector layer 226 from the ohmic contact 218 by the passivation layer 224 can provide stable thermal characteristics of the light-emitting diode in operation.

Figure 1B:
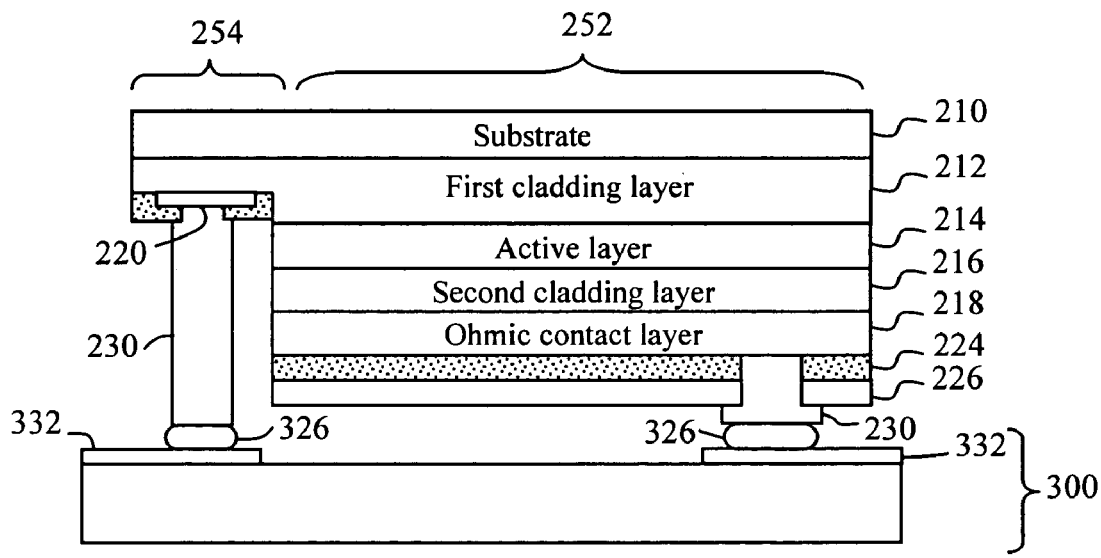
FIG. 1B is a schematic view of an assembly of the light-emitting device on a substrate according to an embodiment of the invention.

FIG. 1B illustrates the assembly of a light-emitting device on a substrate according to an embodiment of the invention. The light-emitting device 200 can be mounted on a substrate 300 provided with contact pads 332. The substrate 300 can be a printed circuit substrate. A reflow process can be performed to electrically connect the electrode pads 230 to the contact pads 332 via conductive bumps 326. It is understood that the above connection scheme is exemplary provided for purpose of illustration, and other connection structures such as surface mount techniques or pin connections can be implemented in the invention.

Figure 2A:
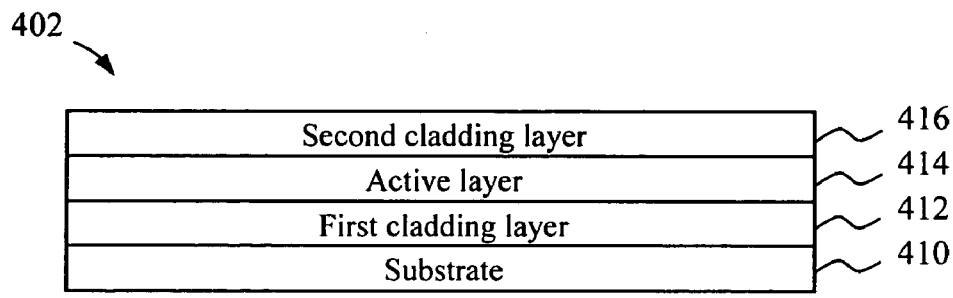
FIG. 2A~2H are schematic views of exemplary steps performed in a manufacturing process of a light-emitting device according to an embodiment of the invention.

FIG. 2A~2H illustrate exemplary steps performed in a process of forming a light-emitting device according to an embodiment of the invention. FIG. 2A illustrates an intermediary stage of the manufacturing process where a multi-layer structure 402 has been formed, including a substrate 410, a first cladding layer 412, an active layer 414 and a second cladding layer 416 stacked up, respectively.

The substrate 410 can be made of a transparent material such as sapphire, SiC or the like. The first cladding layer 412 can be an n-type GaN layer. The active layer 414 can include a multi-quantum well layer structure. The second cladding layer 416 can be a p-type GaN layer.

Figure 2B:
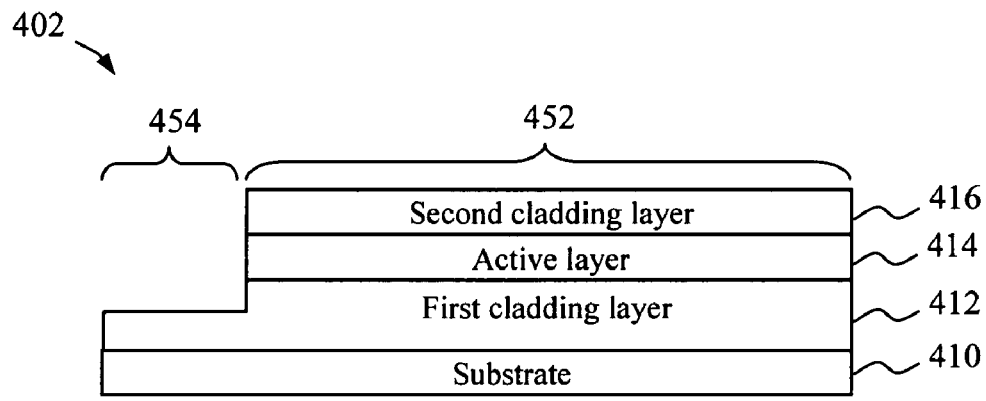

As shown in FIG. 2B, the multi-layer structure 402 is patterned to define a light emitting area 452 and an adjacent area 454 where a surface of the first cladding layer 412 is exposed. Photolithography and etching processes can be performed to define the areas 452, 454 in the multi-layer structure 402.

Figure 2C:
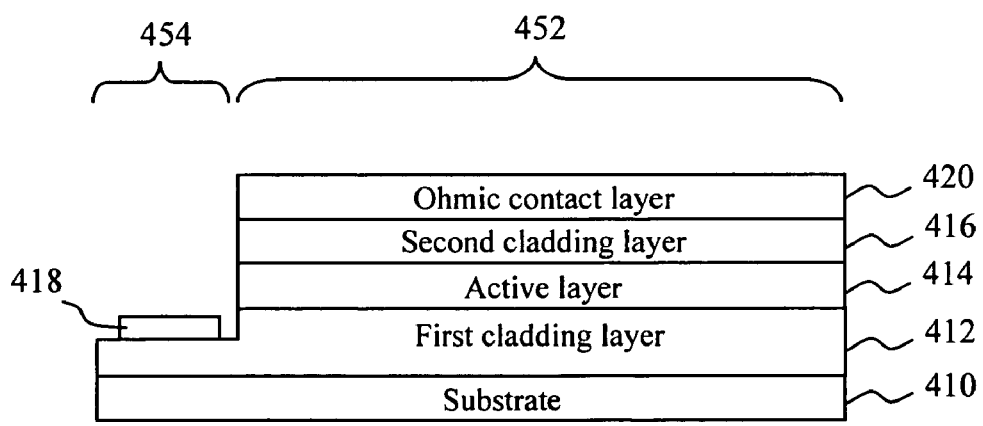

Referring to FIG. 2C, first and second ohmic contact layers 418, 420 are respectively formed on the first and second cladding layers 412, 416. The first ohmic contact layer 418 can be made of a material composition including Ti/Al, Ti/Al/Ti/Au, Ti/Al/Pt/Au, Ti/Al/Ni/Au, Ti/Al/Pd/Au, Ti/Al/Cr/Au, Ti/Al/Co/Au, Cr/Al/Cr/Au, Cr/Al/Pt/Au, Cr/Al/Pd/Au, Cr/Al/Ti/Au, Cr/Al/Co/Au, Cr/Al/Ni/Au, Pd/Al/Ti/Au, Pd/Al/Pt/Au, Pd/Al/Ni/Au, Pd/Al/Pd/Au, Pd/Al/Cr/Au, Pd/Al/Co/Au, Nd/Al/Pt/Au, Nd/Al/Ti/Au, Nd/Al/Ni/Au, Nd/Al/Cr/Au, Nd/Al/Co/A, Hf/Al/Ti/Au, Hf/Al/Pt/Au, Hf/Al/Ni/Au, Hf/Al/Pd/Au, Hf/Al/Cr/Au, Hf/Al/Co/Au, Zr/Al/Ti/Au, Zr/Al/Pt/Au, Zr/Al/Ni/Au, Zr/Al/Pd/Au, Zr/Al/Cr/Au, Zr/Al/Co/Au, TiNx/Fi/Au, $TiN_x$/Pt/Au, $TiN_x$/Ni/Au, $TiN_x$/Pd/Au, $TiN_x$/Cr/Au, $TiN_x$/Co/Au $TiWN_x$/Ti/Au, $TiWN_x$/Pt/Au, $TiWN_x$/Ni/Au, $TiWN_x$/Pd/Au, $TiWN_x$/Cr/Au, $TiWN_x$/Co/Au, NiAl/Pt/Au, NiAl/Cr/Au, NiAl/Ni/Au, NiAl/Ti/Au, Ti/NiAl/Pt/Au, Ti/NiAl/Ti/Au, Ti/NiAl/Ni/Au, Ti/NiAl/Cr/Au or the like.

The second ohmic contact layer 420 can be made of a metallic composition including Ni/Au, Ni/Pt, Ni/Pd, Ni/Co, Pd/Au, Pt/Au, Ti/Au, Cr/Au, Sn/Au, Ta/Au, TiN, $TiWN_x$, $WSi_x$, or the like. Alternatively, the second ohmic contact layer 420 can be made of a transparent conductive oxide such as indium tin oxide, cadmium tin oxide, ZnO:Al, $ZnGa_2O_4$, $SnO_2$:Sb, $Ga_2O_3$:Sn, $AgInO_2$:Sn, $In_2O_3$:Zn, NiO, MnO, FeO, $Fe_2O_3$, CoO, CrO, $Cr_2O_3$, $CrO_2$, CuO, SnO, $GaO,RuO_2$, $Ag_2O$, $CuAlO_2$, $SrCu_2O_2$, $LaMnO_3$, PdO or the like.

Figure 2D:
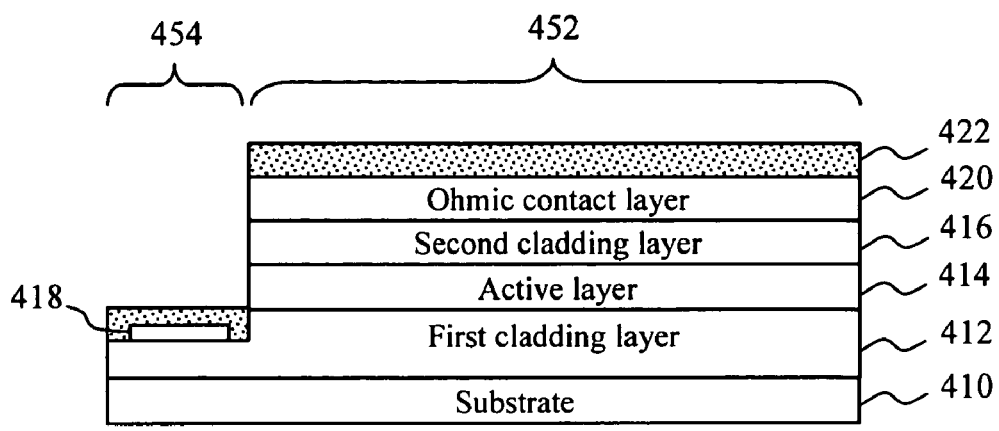

As shown in FIG. 2D, a first passivation layer 422 is formed on the ohmic contact layer 420. The passivation layer 422 can be made of any transparent dielectric material with adequate light transmittance property, the composition of which can include $SiO_x$, $Si_xN_x$, benzocyclobutene (BCB), spin-on-glass (SOG), epoxy-based negative resists such as the ones commercialized by the company MicroChem Corp. under the designations "SU8" and "SU2000", AlN, SiC or the like.

Figure 2E:
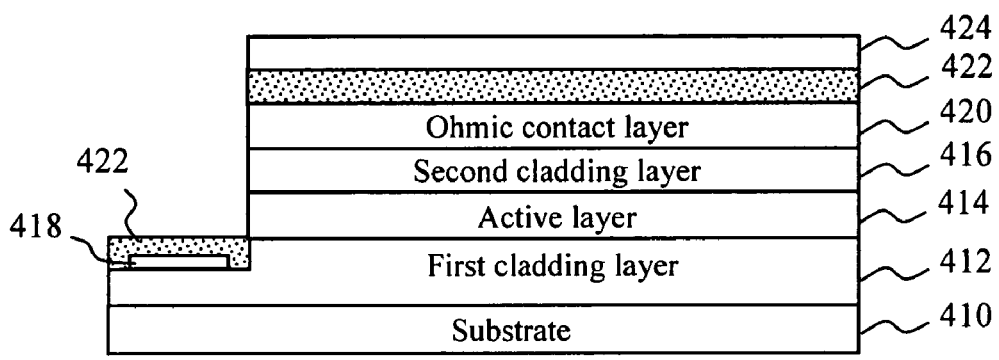

In FIG. 2E, a reflector layer 424 is formed on the first passivation layer 422. In an embodiment, the reflector layer 424 can be exemplary formed with a thickness of about 150 nm. The reflector layer 424 can be made of a material having high reflectance property, the composition of which can include Pd, Rh, Ag, Al, Ni, Pt, Ti, Cu, Au, Cr, In, Sn, Ir, or the like. Methods implemented to form the reflector layer 424 can include a vapor deposition process.

Figure 2F:
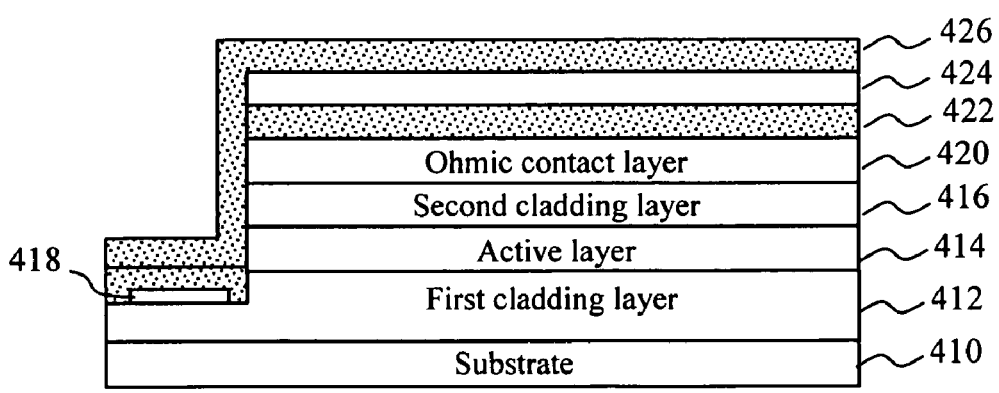

Optionally, a second passivation layer 426 can be formed to cover the reflector layer 424, as shown in FIG. 2F. In an embodiment, materials similar to those of the first passivation layer 422 can be adequate to form the second passivation layer 426. Notwithstanding, other materials including opaque materials can be also suitable.

Figure 2G:
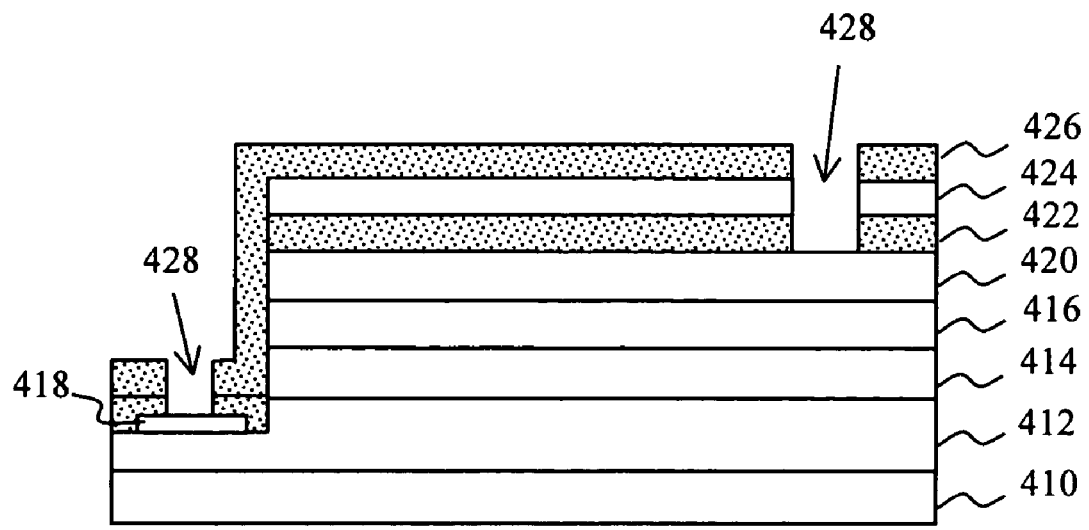

In FIG. 2G, the passivation layers 422, 426 and the reflector layer 424 are patterned to form openings 428 respectively exposing areas of the first and second ohmic contact layers 418, 420. In an example of implementation, this patterning operation can include performing conventional photolithography and etching processes.

Figure 2H:
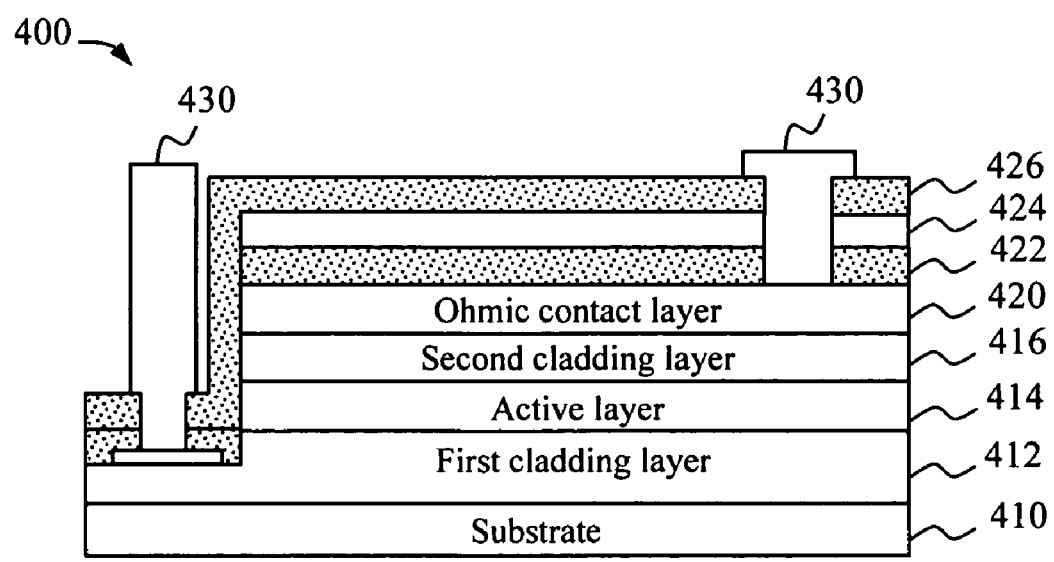

In FIG. 2H, electrode pads 430 are respectively formed through the openings 430 to contact with the first and second ohmic contact layers 418, 420. The electrode pads 430 can be made of conductive materials such as metallic alloys. The electrode pads 430 constitute the electric terminals of the light-emitting device 400 through which an electric signal is applied to drive its illumination.

Realizations in accordance with the present invention have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of the invention as defined in the claims that follow.

What is claimed is:

1. A process of forming a light-emitting device, comprising:

forming a multi-layer structure including the stack of one or more active layer configured to irradiate light in response to the application of an electric signal;

forming a transparent passivation layer to cover an outmost surface of the multi-layer structure;

forming a reflector layer over the transparent passivation layer, so that the transparent passivation layer is between the reflector layer and the outmost surface of the multi-layer structure including the one or more active layer; and forming a plurality of electrode pads coupling with the multi-layer structure.

2. The process according to claim 1, wherein the transparent passivation layer is made of a material composition including $SiO_x$, $Si_xN_x$, benzocyclobutene, spin-on-glass, epoxy-based negative resists, AlN, SiC or the like.

3. The process according to claim 1, wherein the reflector layer is made of a material composition including Pd, Rh, Ag, Al, Ni, Pt, Ti, Cu, Au, Cr, In, Sn, Ir, or the like.

4. The process according to claim 1, wherein the reflector layer has a reflectivity greater than about 65%.

5. The process according to claim 1, further comprising forming a second passivation layer covering the reflector layer.

6. The process according to claim 1, wherein forming a plurality of electrode pads coupling with the multi-layer structure comprises:

patterning the reflector layer and the transparent passivation layer to form at least one opening exposing an area of the multi-layer structure; and forming one electrode pad connecting with the multi-layer structure through the opening patterned through the reflector layer and the transparent passivation layer.

* * * * *